(12) United States Patent
Chu

(10) Patent No.: US 9,368,485 B1
(45) Date of Patent: Jun. 14, 2016

(54) ELECTROSTATIC DISCHARGE CIRCUITRY WITH SEPARATE POWER RAILS

(71) Applicant: Altera Corporation, San Jose, CA (US)

(72) Inventor: Charles Y. Chu, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/563,620

(22) Filed: Dec. 8, 2014

Related U.S. Application Data

(60) Provisional application No. 61/925,796, filed on Jan. 10, 2014.

(51) Int. Cl.
*H02H 9/04* (2006.01)
*H01L 27/02* (2006.01)
*H01L 29/66* (2006.01)
*H01L 29/06* (2006.01)

(52) U.S. Cl.
CPC ........ *H01L 27/0255* (2013.01); *H01L 27/0288* (2013.01); *H01L 29/0649* (2013.01); *H01L 29/66098* (2013.01)

(58) Field of Classification Search
CPC ............ H01L 27/0248; H01L 27/0255; H01L 27/0285; H01L 27/0288
See application file for complete search history.

(56) References Cited

U.S. PATENT DOCUMENTS

| 7,203,045 | B2 | 4/2007 | Chatty et al. | |
| 7,453,676 | B2 | 11/2008 | Huh | |
| 8,179,647 | B2 | 5/2012 | Chu et al. | |
| 8,643,988 | B1 | 2/2014 | Kwong | |
| 8,760,828 | B2 | 6/2014 | Ma | |
| 2011/0198678 | A1* | 8/2011 | Ker | H02H 9/046 257/296 |
| 2013/0093052 | A1* | 4/2013 | Ma | H01L 23/5228 257/533 |
| 2013/0342940 | A1* | 12/2013 | Taghizadeh | H02H 9/046 361/56 |
| 2014/0036397 | A1* | 2/2014 | Yang | H02H 9/046 361/56 |
| 2014/0160604 | A1 | 6/2014 | Lai | |

* cited by examiner

*Primary Examiner* — John C Ingham

(57) ABSTRACT

In one embodiment, an integrated circuit includes an input-output circuit, first and second electrostatic discharge diode circuits, first and second power clamp circuits and first, second and third voltage rails. The input-output circuit includes an input node that is coupled to an input-output pad. The first electrostatic discharge diode circuit may be coupled between the first and third voltage rails whereas the second electrostatic discharge diode circuit may be coupled between the second and third voltage rails. In addition to that, the first voltage rail may also be coupled to the first power clamp circuit and the second voltage rail may also be coupled to the second power clamp circuit.

12 Claims, 6 Drawing Sheets

FIG. 1

ELECTROSTATIC DISCHARGE CIRCUITRY WITH SEPARATE POWER RAILS

This application claims the benefit of and claims priority to provisional patent application No. 61/925,796, filed Jan. 10, 2014, which is hereby incorporated by reference herein in its entirety.

BACKGROUND

As the size of transistors shrinks with every new generation of semiconductor devices, there has been a significant decrease in the gate-oxide thickness of transistors. Unlike thick gate gate-oxide transistors, thin gate-oxide transistors may easily be damaged even when there are relatively small voltage spikes. This is especially prominent when there is a transient discharge of static charges into or out of the transistors, arising as a result of human handling or machine contact.

Generally, an electrostatic discharge (ESD) protection circuit may be utilized to resolve such transient discharge of static charges. The ESD protection circuit may allow the excessive charges to flow through a pathway that is isolated from electrical pathways that are connected to functional circuitry on the semiconductor device.

ESD protection schemes may be implemented at a system level or a device level, depending on the particular circuit design. Specific implementations may be targeted to resolve specific types of ESD occurrences. As an example, a system level ESD protection scheme protects the overall system from ESD occurrences while a device level ESD protection scheme may protect a specific circuit within a device from ESD occurrences.

Generally, the ESD protection circuit at the device level may include a dual-diode architecture. However, with the shrinking dimensions of transistors, the conventional dual-diode architecture may not be able to handle an ESD event, especially the one modelled after a charge-device modelling (CDM) technique. Although, designers may have resolved the problems of dual-diode architecture with shrinking transistors by increasing the size of the ESD protection circuit, it has been at a great expense of circuit speed.

SUMMARY

Embodiments described herein include a separated power rails electrostatic discharge circuit and a method to form the electrostatic discharge circuit. It should be appreciated that the embodiments can be implemented in numerous ways, such as a process, an apparatus, a system, a device, or a method. Several embodiments are described below.

In one embodiment, an integrated circuit includes an input-output circuit, first and second power clamp circuits and first and second power rails. The input-output circuit includes an input node that may be coupled to an input-output pad. The first power rail may be coupled to the first power clamp circuit and the input-output pad, and the second power rail may be coupled to the second power clamp circuit and the input node.

In addition to that, the integrated circuit may also include first, second, third and fourth electrostatic discharge diodes. The first electrostatic discharge diode may be coupled between the input-output pad and the first power rail and the second electrostatic discharge diode may be coupled between the input node and the second power rail. The third electrostatic discharge diode may be coupled between a ground power rail and the input-output pad and the fourth electrostatic discharge diode may be coupled between the ground power rail and the input node.

In another embodiment, a method of forming an electrostatic discharge circuit may include a step to form first, second and third voltage rails. In addition to that, the method may include a step to form first and second electrostatic discharge diode circuits. In one embodiment, the first electrostatic discharge diode circuit may be coupled between the first and third voltage rails. The second electrostatic discharge diode circuit may be coupled between the second and third voltage rails. The method also includes a step to form a power clamp circuit between the first and third voltage rails.

Further features of the invention, its nature and various advantages will be more apparent from the accompanying drawings and the following detailed description of the preferred embodiments.

BRIEF DESCRIPTION OF THE DRAWINGS

FIG. 1 shows an illustrative integrated circuit in accordance with one embodiment of present invention.

DETAILED DESCRIPTION

Figure 2:
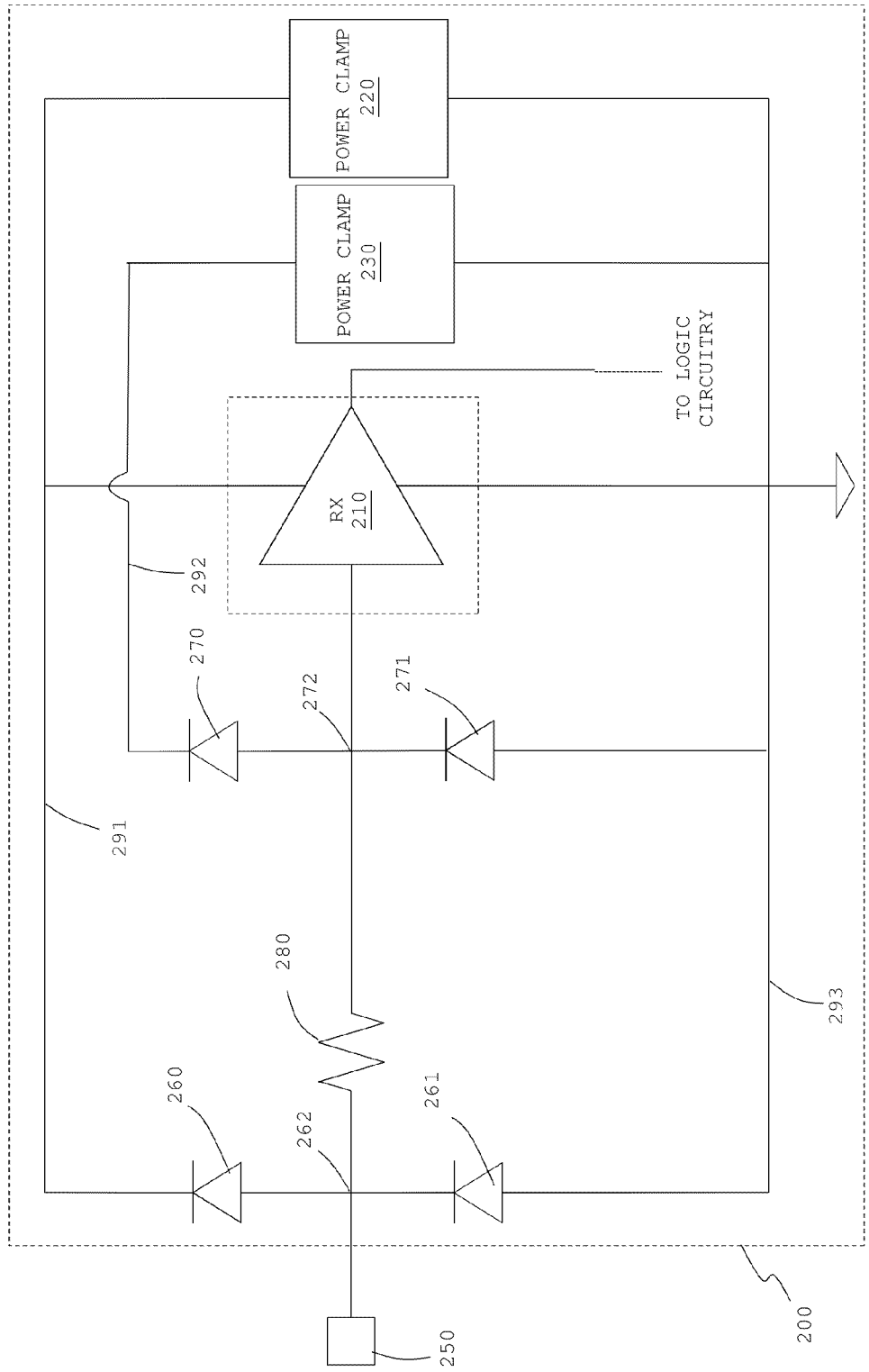
FIG. 2 shows an illustrative electrostatic discharge (ESD) circuit surrounding a receiver (RX) circuit in accordance with one embodiment of the present invention.

The following embodiments describe electrostatic discharge circuit with separate power rails and a method to form such type of electrostatic discharge circuit. It will be obvious, to one skilled in the art, that the present exemplary embodiments may be practiced without some or all of these specific details. In other instances, well-known operations have not been described in detail in order not to unnecessarily obscure the present embodiments.

Figure 1:
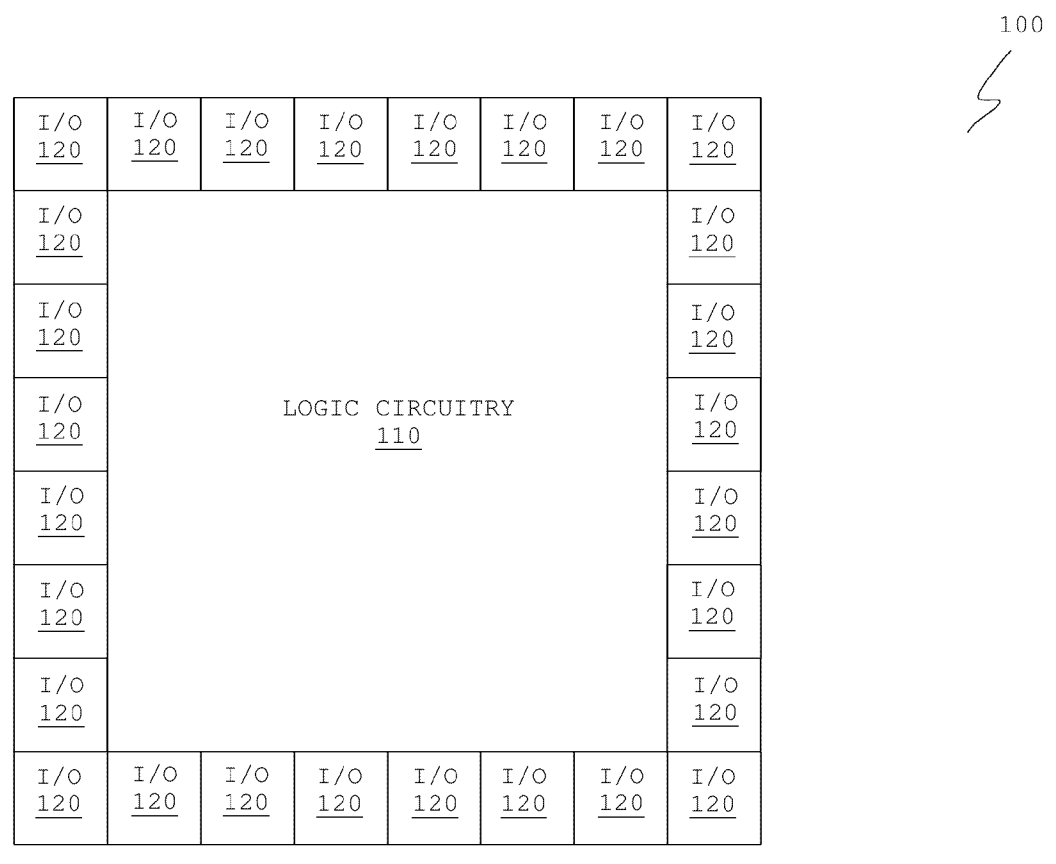

FIG. 1, meant to be illustrative and not limiting, illustrates integrated circuit 100 in accordance with one embodiment of present invention. Integrated circuit 100 includes logic circuitry 110 and multiple input/output (I/O) circuits 120.

In one embodiment, integrated circuit 100 may be an application specific integrated circuit (ASIC) device, an application standard specific product (ASSP) device, a programmable logic device (PLD) or a microprocessor device. In general, ASIC and ASSP devices may perform fixed and dedicated functions. PLD devices may be programmable to perform a variety of functions. An example of a PLD device may be a field programmable gate array (FPGA) device. Microprocessor devices, coupled together with other devices (e.g., a memory device), may be utilized to perform instructions provided within a programming code.

Integrated circuit 100 may be used in different types of high speed systems, for example a communication system such as wireless systems, wired systems, etc. In one embodiment, integrated circuit 100 may be a PLD that is utilized for controlling data transfer between different devices, for example, a microprocessor device and a memory device. Hence, integrated circuit 100 may include circuits that may be used to implement various transmission standards that allow integrated circuit 100 to communicate with external devices such as memory devices (not shown) that may be coupled to integrated circuit 100.

Referring still to FIG. 1, I/O circuits 120 occupies the peripheral portion of integrated circuit 100, whereas logic circuitry 110 occupies the center region of integrated circuit 100. It should be appreciated that the arrangement of I/O circuits 120 and logic circuitry 110 on integrated circuit 100 may vary depending on the requirements of a particular device.

It should be appreciated that logic circuitry 110 may be utilized for performing core functions of integrated circuit 100. Therefore, logic circuitry 110 may include specific circuitry for the functions that define integrated circuit 100. For example, logic circuitry 110 may include circuits that perform memory device addressing and processing of information retrieved from the memory device when integrated circuit 100 is used as a memory controller. In another example, logic circuitry 110 may include programmable logic elements when integrated circuit is a PLD. The programmable logic elements may further include circuits such as look-up table circuitry, multiplexers, product-term logic, registers, memory circuits and the like. The programmable logic elements may be programmed by a user (e.g., a designer or an engineer) to perform desired functions.

I/O circuits 120 may be utilized for transferring signals into or out of integrated circuit 100. For example, signals from logic circuitry 110 may be transferred out of integrated circuit 100 through one of the I/O circuits 120. Additionally, signals received from an external device (external to integrated circuit 100) may be transferred to logic circuitry 110 through one of the I/O circuits 120. In one embodiment, I/O circuits 120 may be considered as external interfacing circuitry of integrated circuit 100. Signals may be transferred out or received by one of the I/O circuits 120 via its respective I/O pin (not shown).

Referring still to FIG. 1, each I/O circuit 120 may include an electrostatic discharge (ESD) protection circuit, a receiver circuit and a transmitter circuit. The receiver and transmitter circuits of a particular I/O circuit 120 may be utilized to facilitate the receiving and transmitting, respectively, of I/O signals. The ESD protection circuits may be utilized for protecting the receiver circuits from ESD occurrences. It should also be appreciated that there may be other circuits within I/O circuits 120, which are not described in the embodiment of FIG. 1 in order to not unnecessarily obscure the present invention.

FIG. 2, meant to be illustrative and not limiting, illustrates electrostatic discharge (ESD) circuit 200 and receiver (RX) circuit 210 in accordance with one embodiment of the present invention. ESD circuit 200 includes two power rails 291 and 292, four diodes 260, 261, 270 and 271, two power clamps 220 and 230, one ground rail 293 and resistor 280.

In one embodiment, receiver circuit 210 may be a circuit within one of I/O circuits 120 of FIG. 1. Receiver circuit 210 may be utilized for receiving signals from an external device (i.e., external to integrated circuit 100 of FIG. 1) via pad 250. Pad 250 may also be known as input-output pad, in one embodiment. Receiver circuit 210 may include multiple transistors. In one embodiment, transistors within receiver circuit 210 may be high-k dielectric metal gate-oxide (HKMG) transistors. Generally, the HKMG transistors, due to the manner in which they are constructed, may be sensitive to large voltages and electrical currents. For example, an HKMG transistor may have a constant threshold voltage of approximately 0.415 V when a voltage level of less than 2.5 V is applied at its gate terminal. However, the threshold voltage level increases exponentially when the HKMG transistor receives gate terminal voltage levels that are above 2.5 V (e.g., a gate terminal voltage level of 4.5 V may increase the threshold voltage level of the HKMG transistor to 0.46 V). Therefore, in order to maintain an HKMG transistor with consistent electrical behavior, the gate terminal voltage level applied to the HKMG transistor should be limited to 2.5 V.

However, a large amount of electrical currents and voltages may be received via pad 250 when an ESD event occurs. Generally, the ESD event may generate an electrical current as high as 8 amperes (A). Without ESD circuit 200, the large electrical current may be transmitted directly to an input node of receiver circuit 210, and may damage the HKMG transistors within receiver circuit 210. Accordingly, ESD circuit 200 may protect receiver circuit 210 from ESD damage by rerouting the high electrical current to an alternative path away from receiver circuit 210. In one embodiment, ESD circuit 200 may route the extra current through power rails 291.

As shown in the embodiment of FIG. 2, power rails 291 and 292 are physically and electrically separated. Each power rail 291 or 292 may be at a different voltage level. Power rail 292 may be at a voltage level that is higher than power rail 291. In one exemplary embodiment, power rail 291 may be at a voltage level of 1 V whereas power rail 292 may be at a voltage level of 1.8 V. It should be appreciated that power rails 291 and 292 and ground rail 293 may also be referred to as voltage rails.

It should be appreciated that the voltage level at each power rail 291 or 292 may control when electrical current is transmitted through diodes 260 and 270 from their respective terminals 262 and 272. For example, when the voltage level at terminal 262 is higher than the voltage level at power rail 291, diode 260 is forward biased. Hence, electrical current at terminal 262 may be transmitted through diode 260 to power rail 291. Similarly, when the voltage level at terminal 272 (which also serves as the input node for receiver circuit 210) is higher than the voltage level at power rail 292, diode 270 becomes forward biased. When diode 270 is forward biased, electrical current at terminal 272 may be transmitted through diode 270 to power rail 292. Although the embodiment of FIG. 2 only includes two power rails 291 and 292, it should be appreciated that an ESD circuit such as ESD circuit 200 may include more than two power rails (e.g., three electrically isolated power supply terminals, four electrically isolated power supply terminals, five electrically isolated power supply terminals, etc.).

Still referring to FIG. 2, power rails 291 and 292 may be coupled to power clamps 220 and 230, respectively. Each of the power clamps 220 and 230 may absorb different levels of electrical current depending on voltage levels applied to the respective power clamps 220 and 230. The amount of electrical current absorbed by power clamps 220 and 230 may be directly correlated with the applied voltage, as illustrated by current-voltage (IV) plots of FIG. 5. In one embodiment, during an ESD event, power clamp 220 may absorb most of the electrical current (i.e., 8 A). Hence, only a small amount of electrical current may be transmitted to terminal 272 (an input terminal of receiver circuit 210). This protects receiver circuit 210 from ESD events.

Figure 3:
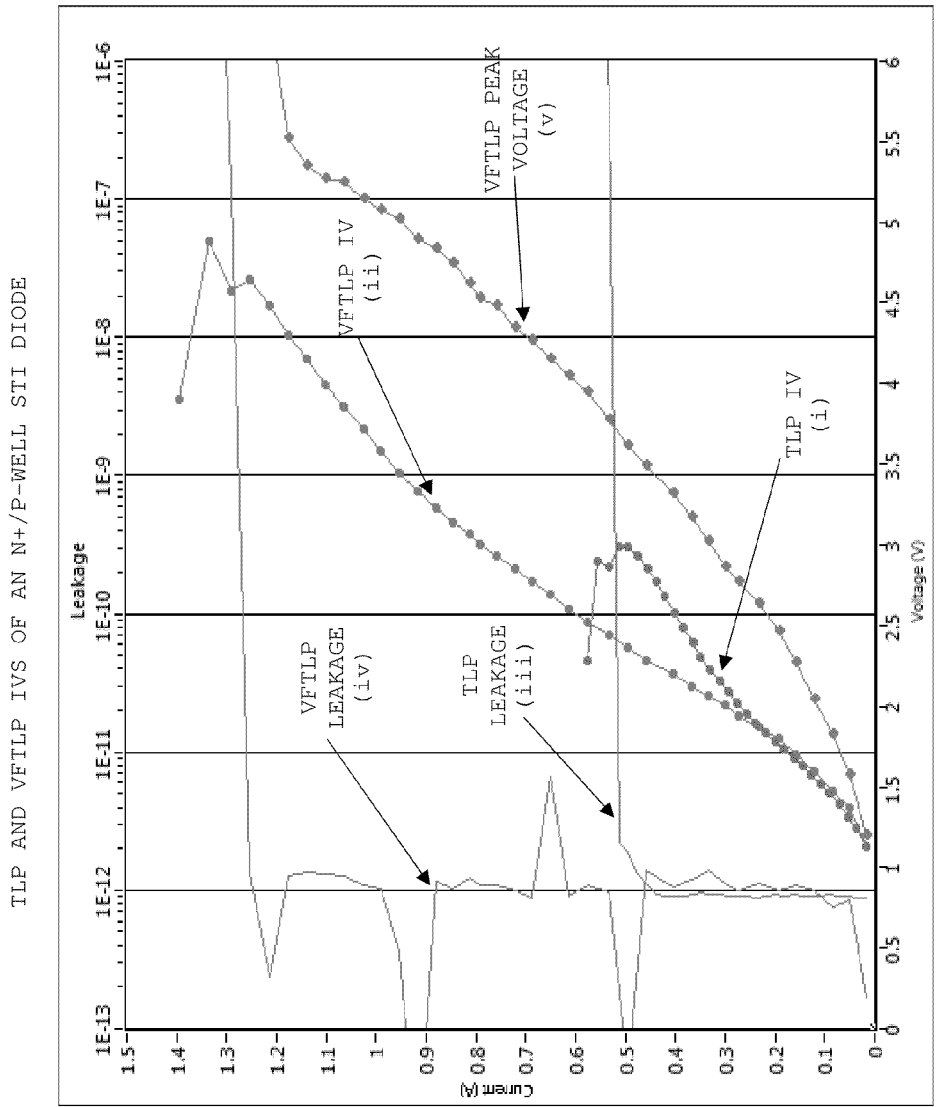
FIG. 3 shows a chart that illustrates the electrical behaviors of a standard N+ diffusion in a P-well region (N+/P-well) of a shallow trench isolation (STI) diode in accordance with one embodiment of the present invention.

In one embodiment, diodes 260, 261, 270 and 271 may be shallow trench isolation (STI) diodes. Diodes 260 and 270 may include a P+ diffusion region formed in an N-well (P+/N-well) whereas diodes 261 and 270 may include an N+ diffusion region formed in a P-well (N+/P-well). The electrical behaviors of P+/N-well STI diodes may be illustrated in FIG. 4, whereas the electrical behaviors of N+/P-well STI diodes are illustrated in FIG. 3. An alternative structure for diodes 260, 261, 270 and 271 may be the gated-diode structure. It should be appreciated that a designer may have the flexibility of choosing the desired structure for diodes 260, 261, 270 and 271 from a range of STI diode structures, gated-diode structures, or any other available diode structures. It should be appreciated that the physical and electrical characteristics of the STI diode structures, gate-diode structure and any other available diode structures may vary depending on different wafer fabrication plants.

Under normal operation (i.e., not under ESD event occurrence), diodes 260, 261, 270 and 271 are in reverse biased states because power rails 291 and 292 are at voltage levels higher than (or equal to) the respective terminals 262 and 272, and terminals 262 and 272 may be at a higher voltage level than ground rail 293 (which may be at a ground voltage level).

However, when an ESD event occurs, a large amount of electrical current may be transmitted through pad 250. Terminal 262 may be at a voltage level that is higher than the voltage level at power rail 291. Therefore, diode 260 may become forward biased, and hence may transmit electrical current through power rail 291 to power clamp 220. In one embodiment, power clamp 220 may receive electrical current in a range of 6 A-10 A (or close to the total current received at terminal 262). Alternatively, when terminal 262 is at a voltage level that is lower than the ground voltage level at power rail 293, diode 261 may become forward biased and an electrical current may be transmitted from power rail 293 to terminal 262.

Still referring to FIG. 2, terminals 262 and 272 are separated by resistor 280. Resistor 280 may be coupled in series with pad 250 and input node of receiver circuit 210. In one embodiment, resistor 280 may have a resistance of 22 ohms. A high resistance resistor 280 may be required to increase the level of electrical current being transmitted through power rail 291 (and therefore reducing the amount of electrical current reaching terminal 272). In one exemplary embodiment, terminal 272 may only receive an electrical current of 200 milliamps (mA).

FIG. 3, meant to be illustrative and not limiting, is a chart showing electrical behaviors of a standard N+ diffusion in a P-well region (N+/P-well) shallow trench isolation (STI) diode in accordance with one embodiment of the present invention. The standard N+/P-well STI diode structure may be provided by a wafer fabrication plant. The chart includes five plots: (i) current-voltage (IV) relationship using transmission-pulsed voltage (TLP) testing, (ii) current-voltage (IV) relationship using very fast transmission-pulsed voltage (VFTLP) testing, (iii) leakage current in N+/P-well region using the TLP testing, (iv) leakage current in N+/P-well STI diode using the VFTLP testing, and (v) peak voltages supplied through the VFTLP testing.

The plots include electrical behaviors based on a TLP or VFTLP testing. It should be appreciated that the TLP testing includes supplying square pulses with different pulse widths to an N+/P-well STI diode. The TLP testing may be utilized to determine the electrical behavior of a circuit experiencing an ESD event. The VFTLP testing may be similar to the TLP testing except that the VFTLP testing may determine the electrical behavior of a circuit under a specific type of ESD event (e.g., a charge-device modelling (CDM) type event).

The IV plots (i) and (ii) shows that electrical current may be transmitted through the N+/P-well STI diode when a voltage level greater than 1 V is applied. In addition to that, plots (i) and (ii) for the N+/P-well STI diode show a fairly linear relationship between the applied voltage and the transmitted electrical current until a point where the transmitted electrical current causes a high leakage current (e.g., above 0.5 A as shown in plot (i) and above 1.2 A as shown in plot (ii)).

Based on plot (ii), N+/P-well STI diode transmits 1.2 A of electrical current when a voltage of 4.5 V is applied. Transmission of a large amount of electrical current through an N+/P-well STI diode may require a larger N+/P-well STI diode than the standard N+/P-well STI diode provided by the wafer fabrication plant. In one embodiment, the amount of electrical current transmitted through the N+/P-well STI diode may be directly correlated to the size of the N+/P-well STI diode. For example, a doubled-sized standard N+/P-well STI diode may transmit 2.4 A of electrical current at 4.5 V (instead of 1.2 A at 4.5 V).

As described above with reference to FIG. 2, plots (i) and (ii) may be utilized to design diodes 261 and 271 of FIG. 2. The N+/P-well STI diodes may be adapted to transmit electrical current when terminals 262 and 272 are at negative voltage levels. It should be appreciated that ESD events may not usually generate negative voltage levels as there are few (or no) occurrences of negative ESD events. Accordingly, diodes 261 and 271 of FIG. 2 may be designed according to the amount of the electrical current that may be transmitted through diodes 260 and 270, respectively, during an ESD event.

The leakage plot (iii) shows that the leakage current may be generally between $10^{-13}$ A and $10^{-12}$ A when supplied with electrical current in the range of 0 A to 0.5 A. However, when the supplied electrical current is greater than 0.5 A, there is an exponential increase in the leakage current in the N+/P-well STI diode. Similarly, the leakage plot (iv) shows that the leakage current may be generally between $10^{-13}$ A and $10^{-12}$ A when supplied with electrical current in the range of 0 A to 1.2 A. However, when the supplied electrical current is greater than 1.2 A, there is an exponential increase of the leakage current in the N+/P-well STI diode. The final plot (v) shows the voltage peaks of the square pulses as part of the VFTLP testing supplied to the N+/P-well STI diode. The plot (v) may indicate a maximum voltage across the N+/P-well STI diode when an electrical current of a particular value is provided. This is for the purpose of knowing whether the N+/P-well diode may breakdown at that electrical current.

Figure 4:
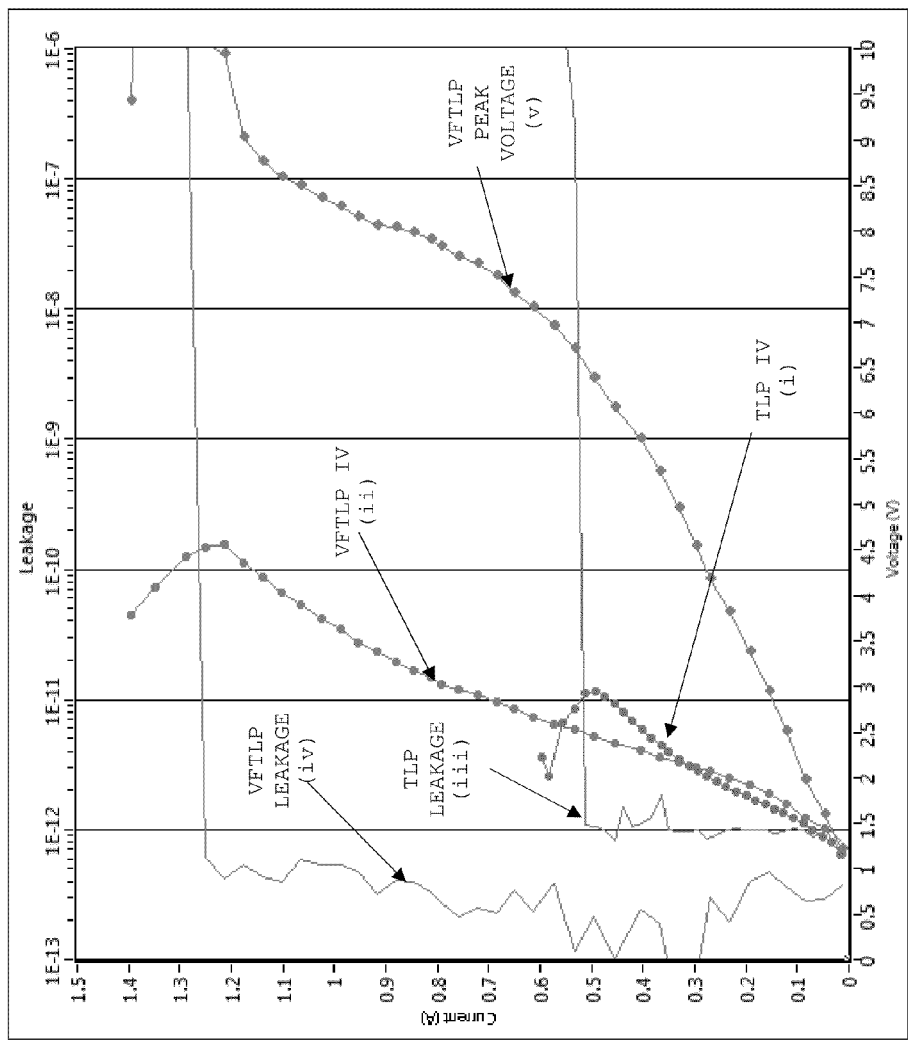
FIG. 4 shows a chart that illustrates the electrical behaviors of a standard P+ diffusion in an N-well region (P+/N-well) of a shallow trench isolation (STI) diode in accordance with one embodiment of the present invention.

FIG. 4, meant to be illustrative and not limiting, is a chart showing the electrical behaviors of a standard P+ diffusion in a N-well region (P+/N-well) shallow trench isolation (STI) diode in accordance with one embodiment of the present invention. Similar to FIG. 3, the chart in the embodiment of FIG. 4 includes five plots: (i) current-voltage (IV) relationship using transmission-pulsed voltage (TLP) testing, (ii) current-voltage (IV) relationship using very fast transmission-pulsed voltage (VFTLP) testing, (iii) leakage currents through P+/N-well region using the TLP testing, (iv) leakage currents through P+/N-well STI diode using the VFTLP testing, and (v) peak voltages supplied through the VFTLP testing. The chart shows the electrical characteristics of a standard P+/N-well STI diode structure provided by the wafer fabrication plant.

The IV plots (i) and (ii) show that electrical currents may be transmitted through the P+/N-well STI diode when a voltage level greater than 1 V is applied. In addition to that, plots (i) and (ii) for the P+/N-well STI diode show a fairly linear relationship between the applied voltage and the transmitted electrical current until a point where the transmitted electrical currents causes a high leakage current (e.g., above 0.5 A for plot (i) and above 1.2 A for plot (ii)). Plots (i) and (ii) may be utilized for designing diodes 260 and 270 of FIG. 2. For example, a standard P+/N-well STI diode may be limited to transmit 1.2 A of electrical current when applied with a voltage level of 4.5 V under a CDM type ESD event, as shown by the plot (ii). Hence, in order to prevent a typical CDM type ESD event (which has an electrical current in the range of 8 A and may be received at terminal 262 through pad 250 of FIG. 2), diode 261 of FIG. 2 may be designed to be as large as seven standard P+/N-well STI diodes. Therefore, most of the electrical current (i.e., 7.8 A) may than be transmitted through diode 260 of FIG. 2, whereas only a small fraction of electrical current may reach terminal 272 of FIG. 2. As not much electrical current is observed at terminal 272 of FIG. 2, diode 270 of FIG. 2 may only be designed to be as large as one standard P+/N-well STI diode.

Comparing FIGS. 3 and 4 shows that gradient values for plots (i) and (ii) of FIG. 4 may be smaller than gradient values for plots (i) and (ii) of FIG. 3, respectively. It should be appreciated that the gradient values of the IV plots may indicate the amount of electrical currents capable of being transmitting through a STI diode at a particular voltage. For example, at one voltage level, a high gradient IV plot electrical behavior STI diode may be able to transmit more electrical current than a relatively small gradient IV plot electrical behavior STI diode.

The leakage plot (iii) shows that the leakage current may be generally between $10^{-13}$ A and $10^{-12}$ A when supplied with electrical currents that is in the range of 0 A to 0.5 A. However, when the supplied electrical current becomes greater than 0.5 A, there is an exponential increase in the leakage currents through P+/N-well STI diode. Similarly, the leakage plot (iv) shows that the leakage current may be generally between $10^{-13}$ A and $10^{-12}$ A when supplied with electrical currents in the range of 0 A to 1.2 A. However, there is an exponential increase of the leakage currents through P+/N-well STI diode when the supplied electrical currents is greater than 1.2 A. The final plot (v) shows the voltage peaks of the square pulse waveforms as part of the VFTLP testing supplied to P+/N-well STI diode. The plot (v) may indicate a maximum voltage across the P+/N-well STI diode when an electrical current of a particular value is provided. The purpose of plot (v) may be to know whether the P+/N-well diode may breakdown at that electrical current.

Figure 5:
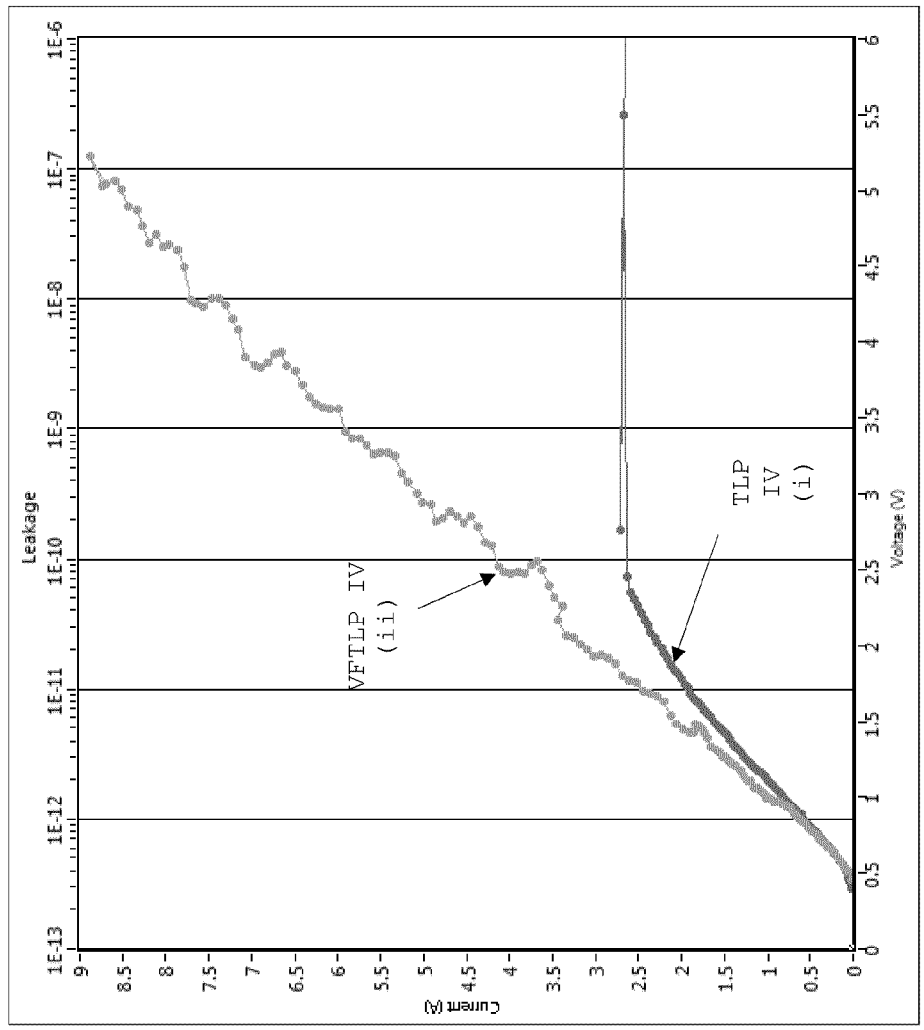
FIG. 5 shows a chart that illustrates the electrical behaviors of a standard power clamp in accordance with one embodiment of the present invention.

FIG. 5, meant to be illustrative and not limiting, is a chart showing electrical behaviors of a standard power clamp in accordance with one embodiment of the present invention. In one embodiment, power clamps 220 and 230 of FIG. 2 may have electrical behavior similar to the ones shown by these plots in the chart. The embodiment in FIG. 5 include two plots: (i) current-voltage (IV) relationship using TLP testing, and (ii) current-voltage (IV) relationship using VFTLP testing. As shown by the plots (i) and (ii), there is a linear relationship between the electrical current and the voltage level supplied to a power clamp. However, as shown in plot (i), the linear relationship ends when the electrical current is greater than 2.5 A.

Plot (ii) shows that a standard power clamp may be able to absorb 8 A of electrical current when applied with a voltage level of 4.5 V. Hence, under a CDM type ESD event, power clamp 220 of FIG. 2 (designed according to the standard power clamp with electrical behaviors as shown in the FIG. 5) may be able to absorb the 8 A of electrical current. As most of the electrical current is absorb by power clamp of FIG. 2, only a fraction of electrical current may be transmitted to terminal 272 of FIG. 2. This may allow an ESD designer more flexibility when designing power clamp 230 of FIG. 2.

Figure 6:
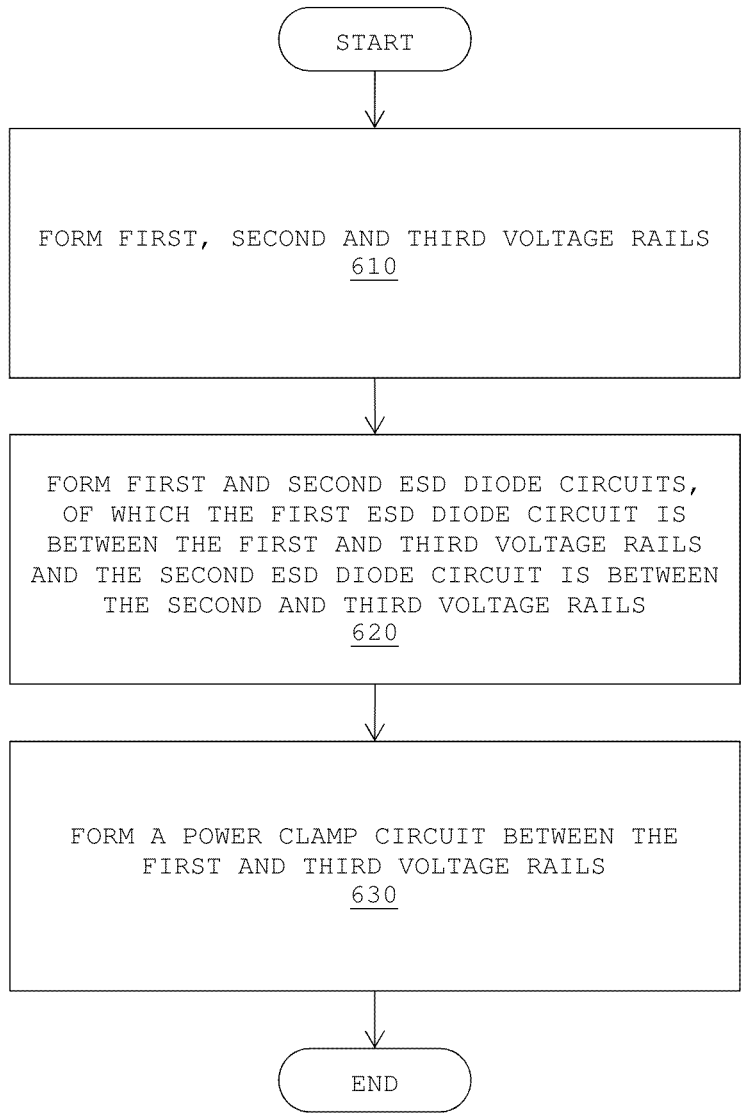
FIG. 6 shows steps for forming an electrostatic discharge (ESD) protection circuit in accordance with one embodiment of the present invention.

FIG. 6, meant to be illustrative and not limiting, shows steps for forming an ESD protection circuit in accordance with one embodiment of the present invention. The ESD protection circuit may be similar to the ESD circuit 200 that is coupled to receiver circuit 210 as shown in FIG. 2. At step 610, three voltage rails are formed. Each of the voltage rails may be at a different voltage level. For example, the voltage rails may be at voltage levels of 1 V, 1.8 V and 0 V, respectively. In one embodiment, the three voltage rails may be similar to the respective power rails 291 and 292 and ground rail 293 of FIG. 2.

At step 620, first and second ESD diode circuits are formed. The first ESD diode circuit may be formed between the first and third voltage rails. In one embodiment, the first ESD diode circuit may include diodes 260 and 261 of FIG. 2. The first ESD diode circuit may also be referred to as a primary ESD circuit. The second ESD diode circuit may be formed between the second and third voltage rails. In one embodiment, the second ESD diode circuit may include diodes 270 and 271 of FIG. 2. The second ESD diode circuit may also be referred to as a secondary ESD circuit. In one embodiment, the second ESD diode circuit may be further coupled to a receiver circuit. The diodes within the ESD diode circuits may be formed as STI diode structures. Each of the first and second ESD diode circuits may include one diode with a P+/N-well STI diode structure and another diode with an N+/P-well STI diode structure.

At step 630, a power clamp circuit is formed between the first and third voltage rails. In one embodiment, the power clamp circuit may be similar to power clamp 220 of FIG. 2. The power clamp circuit may be utilized to absorb the bulk of the electrical current when an ESD event occurs.

When an ESD event occurs, a large amount of electrical current may be transmitted to the power clamp circuit through the first ESD diode circuit and through the first voltage rails. Therefore, only a small amount of electrical current may be received by the second ESD diode circuit. Such redirection of the electrical current protects the receiver circuit from the ESD event.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit, comprising:
   an input-output circuit having an input node that is coupled to an input-output pad via a resistor;
   first and second power clamp circuits;
   first and second power rails and a ground power rail, wherein the first power clamp circuit is coupled between the first power rail and the ground power rail, and wherein the second power clamp circuit is coupled between the second power rail and the ground power rail;
   a first electrostatic discharge (ESD) diode connected between the input-output pad and the first power rail;
   a second electrostatic discharge (ESD) diode connected between the input-output pad and the ground power rail;
   a third electrostatic discharge (ESD) diode connected between the input node and the second power rail; and
   a fourth electrostatic discharge (ESD) diode connected between the input node and the ground power rail.

2. The integrated circuit as defined in claim 1, wherein the resistor has a resistance of greater than 15 ohms.

3. The integrated circuit as defined in claim 1, wherein the electrostatic discharge diodes are shallow trench isolation diodes.

4. The integrated circuit as defined in claim 1, wherein the electrostatic discharge diodes are gate diodes.

5. The integrated circuit as defined in claim 1, wherein the first power clamp circuit handles more than 5 amperes (A) of electrical current at a voltage level of greater than 3 voltages (V).

6. The integrated circuit as defined in claim 1, wherein the input-output circuit further comprises:
   a high-k metal gate oxide transistor device.

7. The integrated circuit as defined in claim 6, wherein the maximum gate oxide voltage for the high-k metal gate oxide transistor device is 2.5 voltages.

8. Electrostatic discharge circuitry, comprising:
   an input-output pad;
   a receiver having an input node that is coupled to the input-output pad via a resistor;
   first, second, and third voltage lines that carry different voltages; and
   first and second electrostatic discharge circuits, wherein the first electrostatic discharge circuit includes a pair of electrostatic discharge (ESD) diodes that is coupled to the input-output pad between the first and third voltage lines, and wherein the second electrostatic discharge circuit includes a pair of electrostatic discharge (ESD) diodes that is coupled to the input node between the second and the third voltage lines.

9. The electrostatic discharge circuitry as defined in claim 8, wherein the first and second voltage lines are at different voltage levels higher than a ground voltage level, and wherein the third voltage line is at the ground voltage level.

10. The electrostatic discharge circuitry as defined in claim 8, further comprising:
    first and second power clamp circuits, wherein the first power clamp circuit is coupled between the first and third voltage lines, and the second power clamp circuit is coupled between the second and third voltage lines.

11. The electrostatic discharge circuitry as defined in claim 8, wherein the first and second electrostatic discharge circuits each comprise at least one shallow trench isolation diode.

12. The electrostatic discharge circuitry as defined in claim 8, wherein the first and second electrostatic discharge circuits each comprise at least one gated-diode.

* * * * *